United States Patent
Doan et al.

(10) Patent No.: US 6,858,450 B1
(45) Date of Patent: Feb. 22, 2005

(54) METHOD OF ALTERNATING GROUNDED/FLOATING POLY LINES TO MONITOR SHORTS

(75) Inventors: Samantha L. Doan, Mountain View, CA (US); Amy C. Tu, San Jose, CA (US); W. Eugene Hill, Moss Beach, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 100 days.

(21) Appl. No.: 10/288,871

(22) Filed: Nov. 5, 2002

(51) Int. Cl.[7] .......................... H01L 31/26; H01L 21/66
(52) U.S. Cl. .............................. 438/14; 438/78; 365/71
(58) Field of Search .............................. 438/14, 17, 57, 438/61, 78; 365/71, 148, 159, 175

(56) References Cited

U.S. PATENT DOCUMENTS 6,310,798 B1 * 10/2001 Morimoto .................. 365/159

* cited by examiner

Primary Examiner—Phuc T. Dang
(74) Attorney, Agent, or Firm—Winstead Sechrest & Minick P.C.

(57) ABSTRACT

A method for in-line testing of a chip to include multiple independent bit Flash memory devices, includes the steps of: grounding every other polysilicon line on the chip to emulate the multiple independent bit Flash memory devices, where an oxide line reside between every two polysilicon lines; scanning the polysilicon lines with an electron beam; examining voltage contrasts between the polysilicon lines; and determining if there are consecutively grounded polysilicon lines based on the voltage contrasts. If consecutive polysilicon lines appear to be grounded, then this indicates that a bridge defect exists between two of the consecutively grounded polysilicon lines. With this method, bridge defects in multiple independent bit Flash memory devices are better detected, leading to improved yield and reliability of the devices.

9 Claims, 9 Drawing Sheets

METHOD OF ALTERNATING GROUNDED/FLOATING POLY LINES TO MONITOR SHORTS

FIELD OF THE INVENTION

The present invention relates to Flash memory devices, and more particularly to the detection of defects in the testing of multiple independent bits Flash memory devices.

BACKGROUND OF THE INVENTION

Figure 1A:
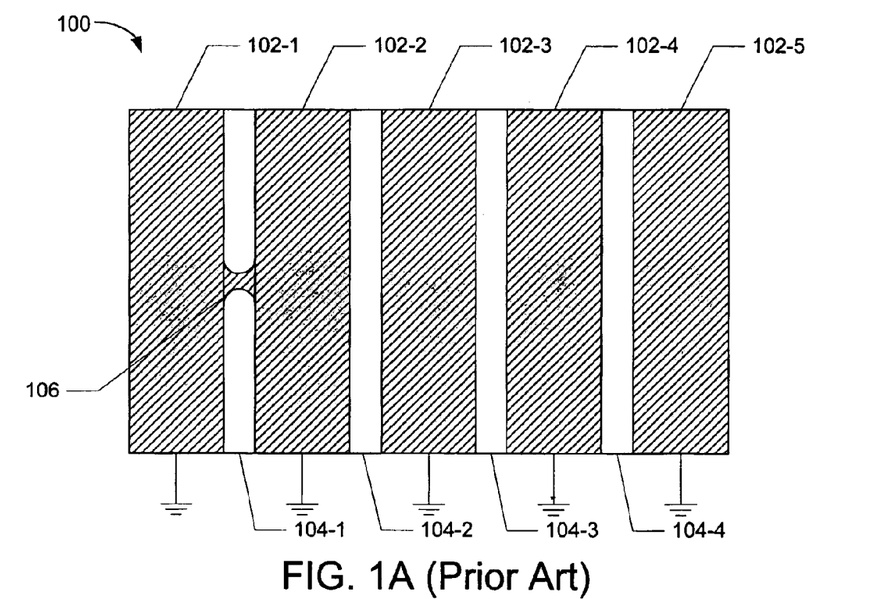
FIGS. 1A and 1B illustrate a surface view and a cross sectional view, respectively, of a chip with a plurality of these multiple independent bit Flash memory devices.
Figure 1B:
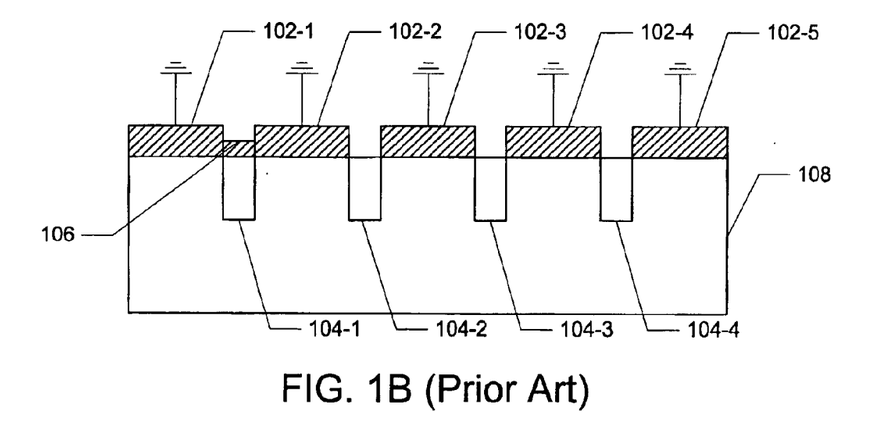

In Flash memory devices with the MirrorBit™ architecture, developed by Advanced Micro Devices™, two bits are stored per cell, with each bit independent of the other. FIGS. 1A and 1B illustrate a surface view and a cross sectional view, respectively, of a chip during the testing of a plurality of these multiple independent bit Flash memory devices. During in-line processing, the chip 100 comprises a plurality of polysilicon lines 102.1–102.5 on a substrate 108. Between the polysilicon lines 102.1–102.5 are oxide lines 104.1–104.4. Bridge defects 106 can occur during manufacturing of polysilicon lines 102.1 and 102.2, which would short the devices containing them.

For Flash memory devices, some bridge defects can be detected using an optical inspection tool. However, an optical inspection tool is limited by the grain/surface noise and may not have the resolution required to detect the bridging in multiple independent bit Flash memory devices. A Scanning Electron Microscope (SEM) tool can be used to view material differences between the polysilicon lines 102.1–102.5 and the oxide lines 104.1–104.4 in conventional Flash memory devices. The bridge 106 would have the same shade as the polysilicon lines 102.1 and 102.2 and a different shade as the oxide line 104.1. However, with multiple independent bit Flash memory devices, the oxide lines 104.1–104.4 are very narrow, making the material contrast difference between the bridge 106 and the oxide line 104.1 very difficult to see.

Accordingly, there exists a need for an improved method for detecting bridge defects in multiple independent bit Flash memory devices. The present invention addresses such a need.

SUMMARY OF THE INVENTION

A method for in-line testing of a chip that includes multiple independent bit Flash memory devices, includes the steps of: grounding every other polysilicon line on the chip, where an oxide line reside between every two polysilicon lines; scanning the polysilicon lines with an electron beam; examining voltage contrasts between the polysilicon lines; and determining if there are consecutively grounded polysilicon lines based on the voltage contrasts. If consecutive polysilicon lines appear to be grounded, then this indicates that a bridge defect exists between two of the consecutively grounded polysilicon lines. With this method, bridge defects in multiple independent bit Flash memory devices are better detected, leading to improved yield and reliability of the devices.

DETAILED DESCRIPTION

The present invention provides an improved method for detecting bridge defects in multiple independent bit Flash memory devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 2 through 9B in conjunction with the discussion below.

Figure 2:
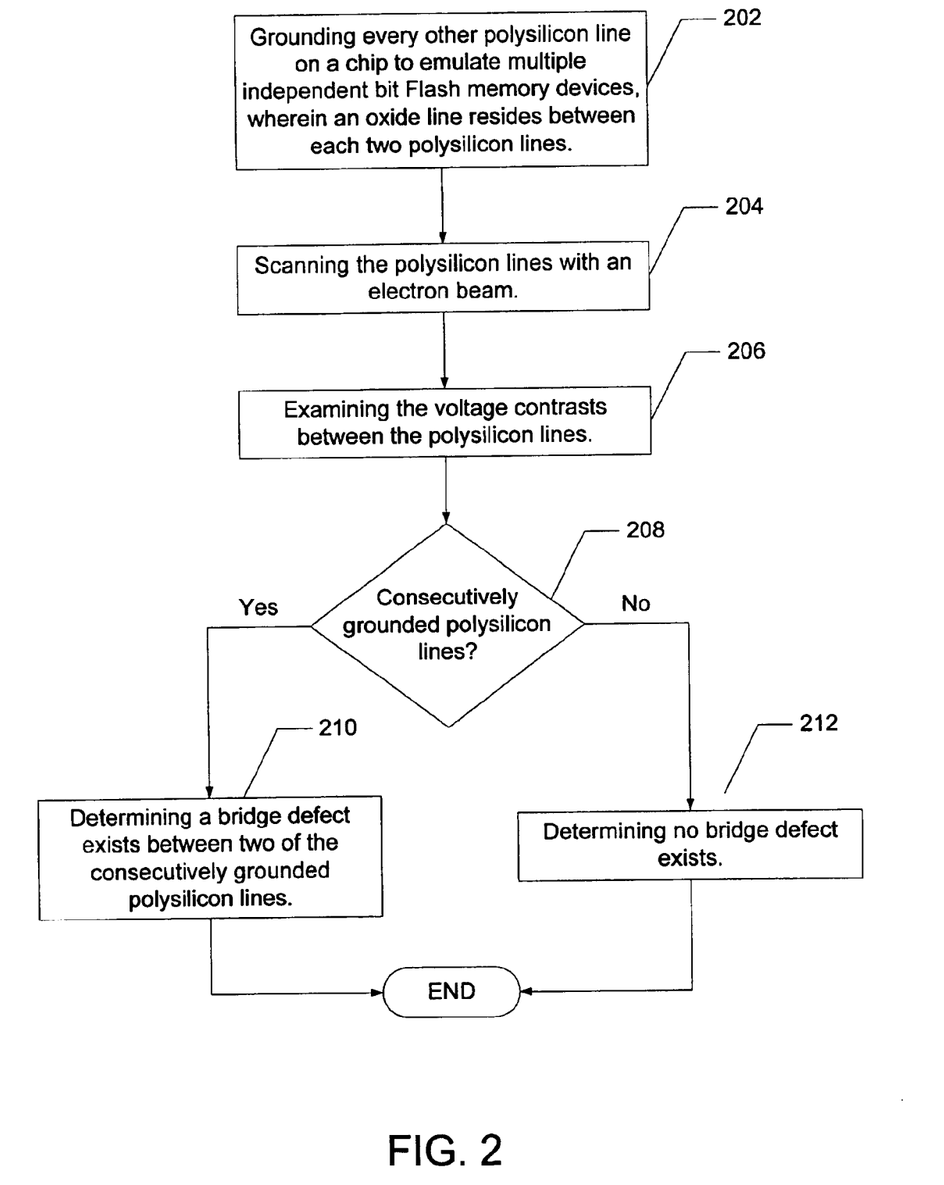
FIG. 2 is a flowchart illustrating a preferred embodiment of a method for detecting bridging defects in multiple independent bit Flash memory devices in accordance with the present invention.
Figure 3A:
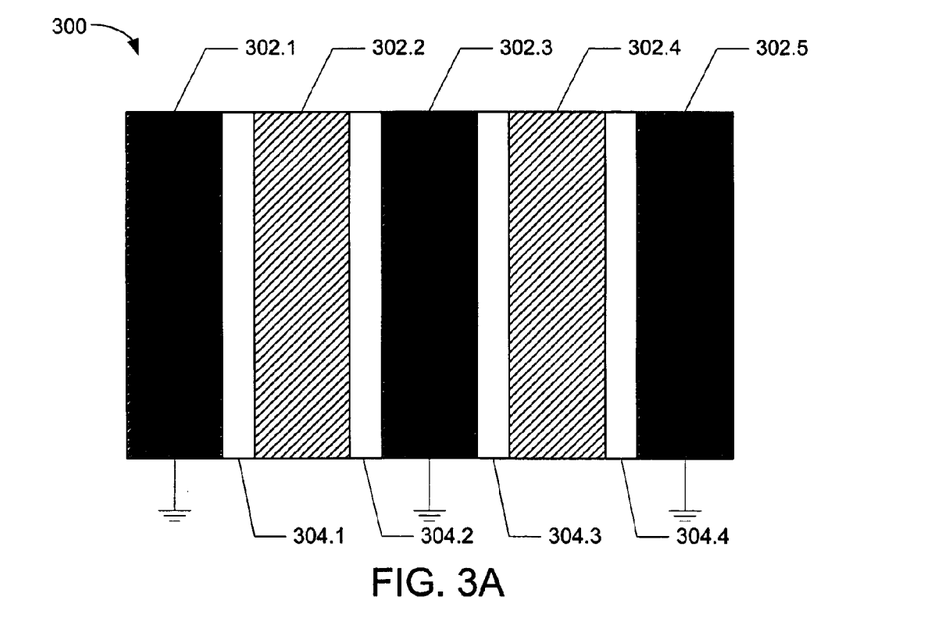
FIGS. 3A and 3B illustrate a surface view and a cross-sectional view, respectively, of a chip with multiple independent bit Flash memory devices utilizing the detection method in accordance with the present invention.
Figure 3B:
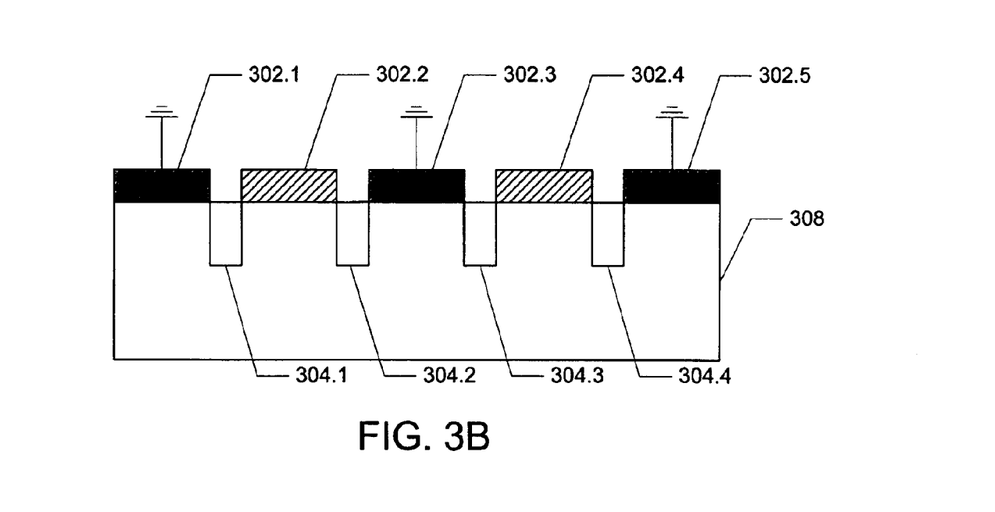

FIG. 2 is a flowchart illustrating a preferred embodiment of a method for detecting bridging defects in multiple independent bit Flash memory devices in accordance with the present invention. FIGS. 3A and 3B illustrate a surface view and a cross-sectional view, respectively, of a chip with multiple independent bit Flash memory devices utilizing the detection method in accordance with the present invention. Referring to FIGS. 2, 3A, and 3B, first, every other polysilicon line 302.1, 302.3, 302.5 on a chip 300 is grounded, via step 202.

The chip 300 emulates multiple independent bit Flash memory devices with oxide lines 304.1–304.4 residing between each polysilicon line 302.1–302.5. Next, the polysilicon lines 302.1–302.5 are scanned with an electron beam, via step 204. The voltage contrasts between the polysilicon lines 302.1–302.5 are then examined, via step 206, such as with a Scanning Electron Microscope (SEM) tool. If the voltage contrasts show consecutively grounded polysilicon lines, via step 208, then a bridge 306 is determined to exist between two of the consecutively grounded polysilicon lines, via step 210. If the voltage contrasts do not show consecutively grounded polysilicon lines, then no bridge is determined to exist, via step 212.

FIGS. 3A and 3B illustrate the voltage contrasts on the chip 300 when no bridge exits, utilizing the detection method in accordance with the present invention. The grounded polysilicon lines 302.1, 302.3, and 302.5 will appear on the SEM tool as one shade (either dark or bright), while the floating polysilicon lines 302.2 and 302.4 appear as another or opposite shade (either bright or dark).

Figure 4A:
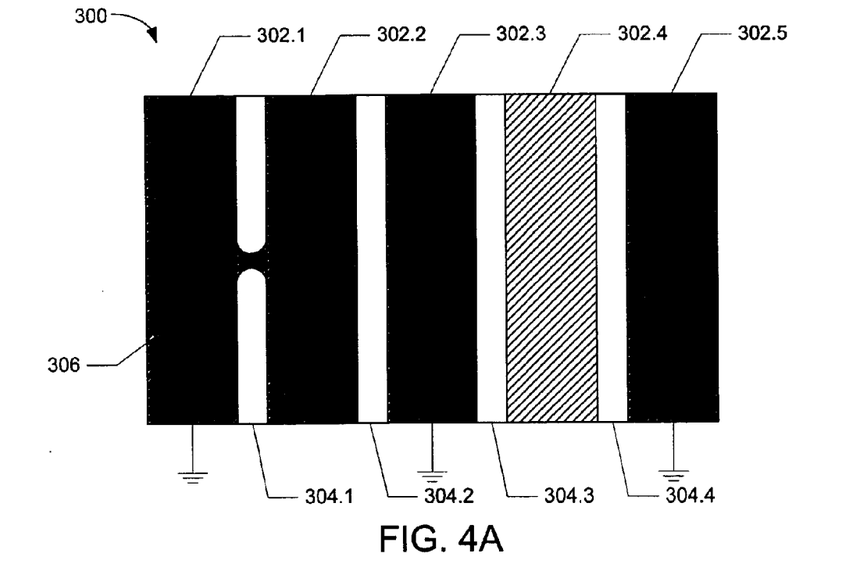
FIGS. 4A and 4B illustrate a surface view and a cross-sectional view, respectively, of the voltage contrasts on the chip when a bridge exists, utilizing the detection method in accordance with the present invention.
Figure 4B:
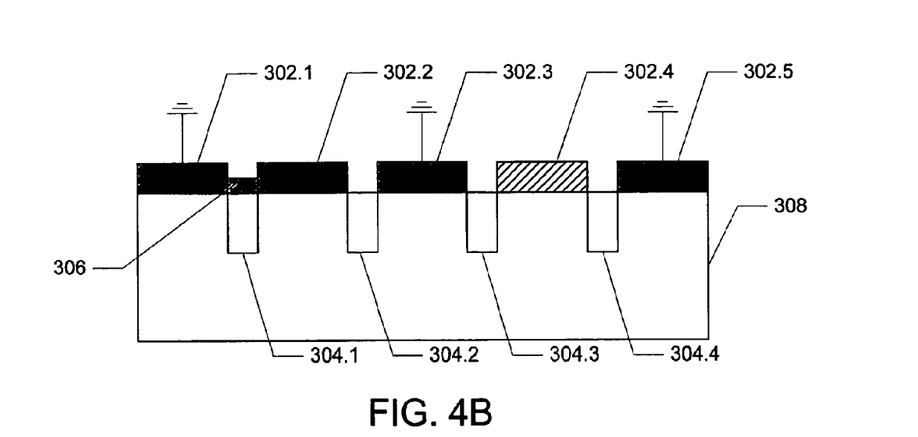

FIGS. 4A and 4B illustrate a surface view and a cross-sectional view, respectively, of the voltage contrasts on the chip 300 when a bridge exists, utilizing the detection method in accordance with the present invention. The consecutive polysilicon lines 302.1, 302.2, and 302.3, as well as the polysilicon line 302.5, will appear on the SEM tool as one shade (either dark or bright), while the floating polysilicon line 302.4 appear as another shade. However, it is known that the polysilicon line 302.2 should be floating instead of grounded. Thus, the grounding of consecutive polysilicon lines 302.1, 302.2, and 302.3 indicates that a bridge 306 exists between the should-be floating polysilicon line 302.2 and either polysilicon line 302.1 or 302.3. Further testing may then be conducted to determine that the bridge exists between the polysilicon lines 302.1 and 302.2. In this manner, the SEM tool can be used to detect bridge defects between polysilicon lines in a chip comprising multiple independent bit Flash memory devices.

Although the present invention has been disclosed in the context of multiple independent bit Flash memory devices, one of ordinary skill in the art will understand that the detecting method may be used with other types of devices without departing from the spirit and scope of the present invention.

Figure 5:
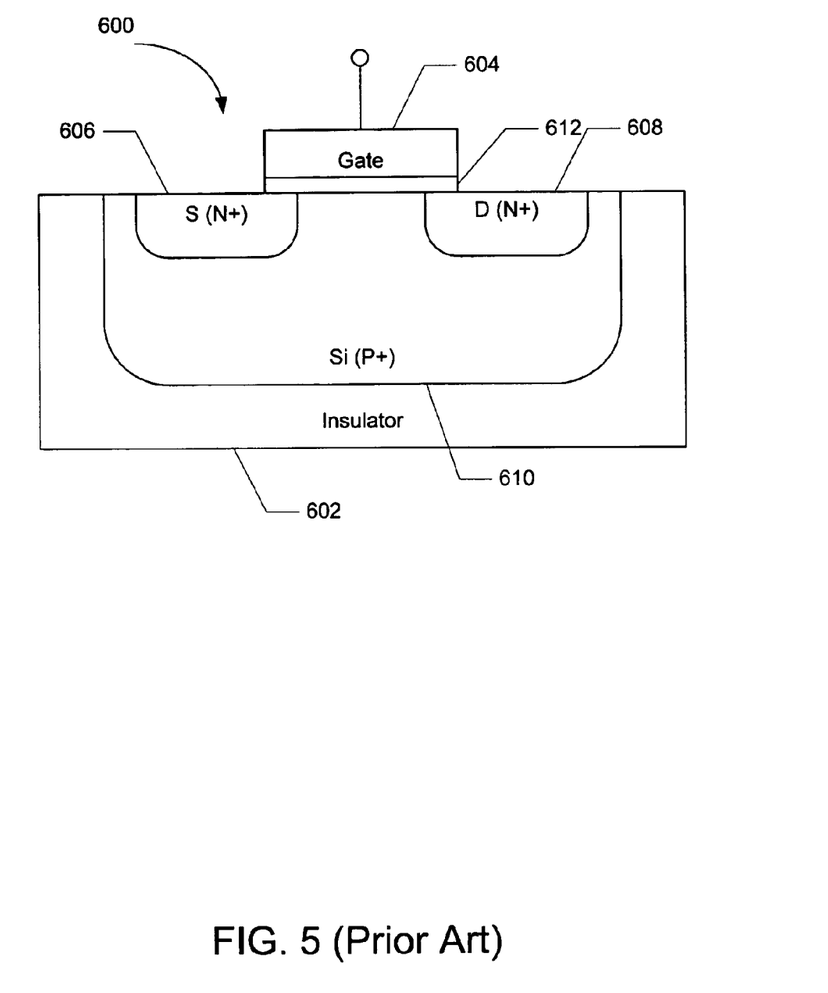
FIG. 5 illustrates a cross-section of an SOI transistor structure.

The SEM tool can also be used to perform in-line inspections of post-gate etch layers on the floating bodies of Silicon-on-Insulator (SOI) transistors. FIG. 5 illustrates a cross-section of an SOI transistor structure. The SOI transistor 600 comprises an insulator layer 602, a polysilicon gate 604, a source 606 (typically doped with N+), a drain 608 (typically doped with N+), a floating substrate or body (typically doped with P+), and a gate oxide 612. Once a polysilicon layer is etched to form the gate 604, an electron beam is used to scan the transistor 600. Voltage contrasts are sometimes seen either on the gate 604 or the active regions 606 and 608. However, these voltage contrasts are not well understood, i.e., it is uncertain what is causing the voltage contrasts and/or it is uncertain whether the voltage contrasts indicate a problem.

Figure 6:
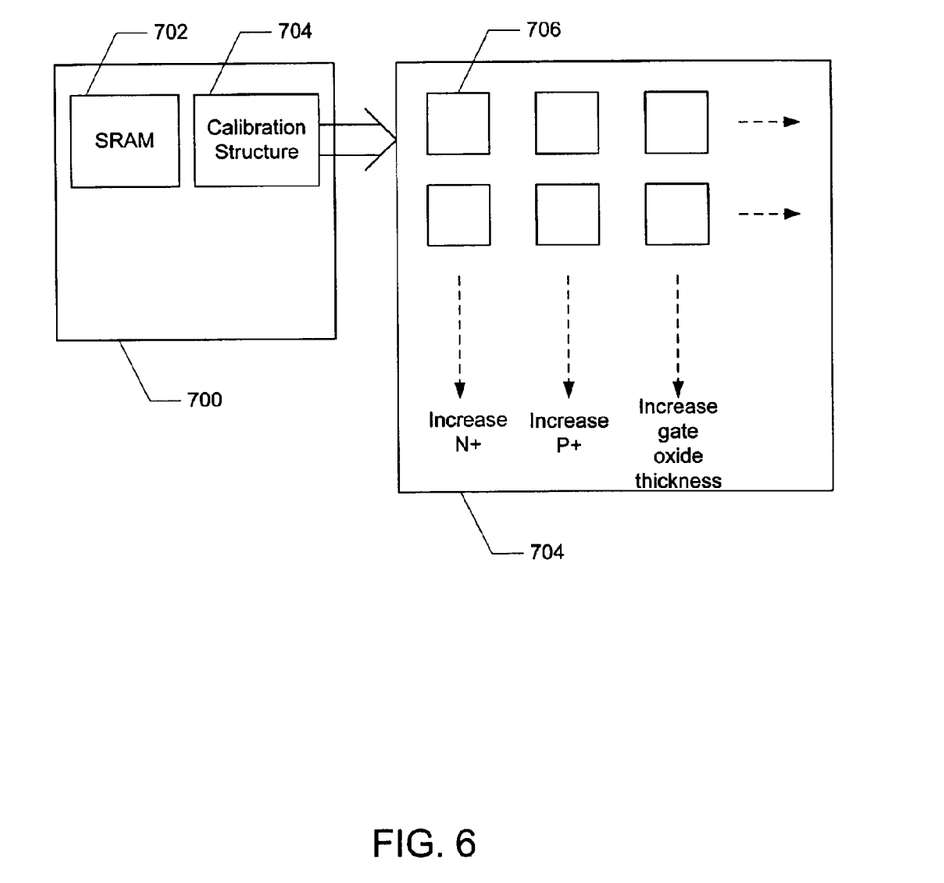
FIG. 6 illustrates the calibration structures for voltage contrasts in SOI transistor structures.

To render the voltage contrasts more meaningful, calibration structures with known leakage or other defects that can lead to voltage contrasts can be formed and used as guides. FIG. 6 illustrates the calibration structures for voltage contrasts. The calibration structures 704 can be placed next to the product, such as the SOI transistors on SRAM 702 on the reticle 700, or in another location. The calibration structures 704 comprise an array of transistors 706, where some process step/parameter, or combination of steps/parameters, are varied in a known way. For example, the array 706 may comprise structures formed with increasing N+doping levels for the source 606 and drain 608, increasing P+ doping levels for the floating body 610, and increasing thickness for the gate oxide 612. Each of these calibration structures would have a particular combination of voltage contrasts. Thus, when SOI transistors on the SRAM 702 are scanned, the observed voltage contrasts may be compared with the voltage contrast profiles given by the calibration structures 704. This comparison provides a guide to possible defects which may be causing the voltage contrasts.

Figure 7A:
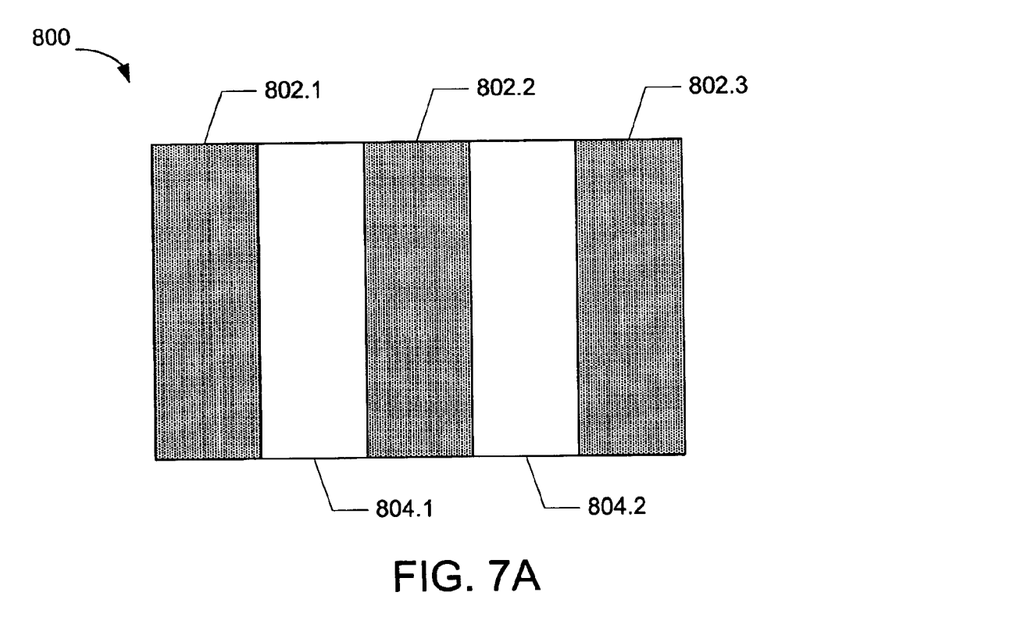
FIGS. 7A and 7B illustrate an ideal case and a non-ideal case, respectively for implant diffusion.
Figure 7B:
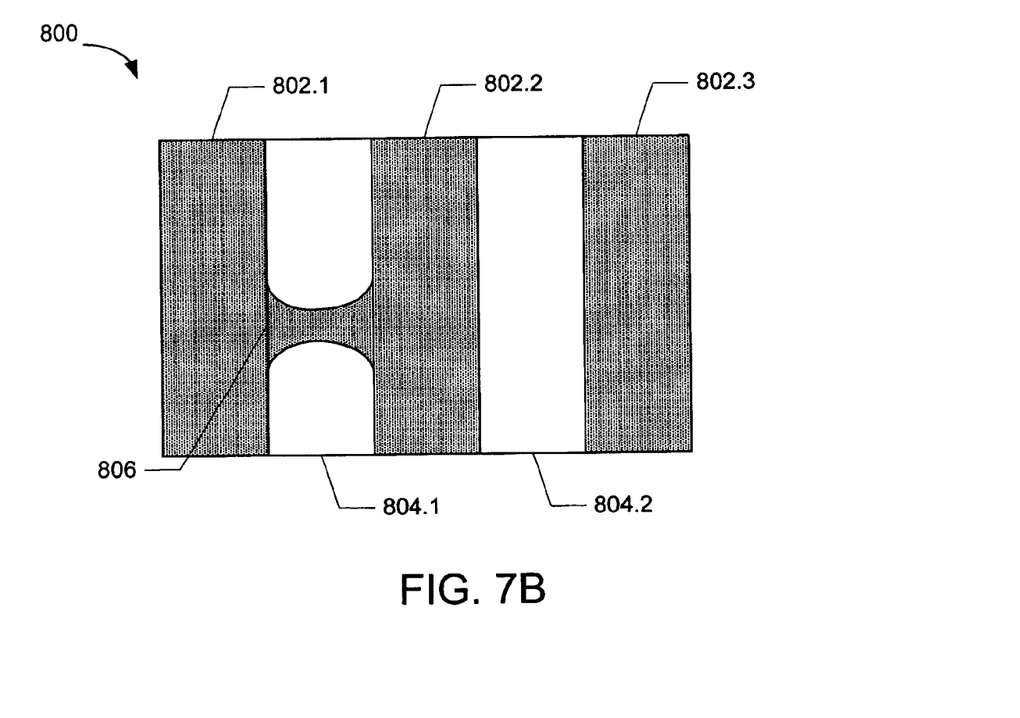

The SEM tool can also be used to detect defects in structures that has no topography, such as implants. Without topography, such defects cannot be observed using an optical detection tool. FIG. 7A illustrates an ideal case for implants. Ideally, the desired implant areas 802.1–802.3 and the desired non-implanted areas 804.1–804.2 are defined on the chip 800. FIG. 7B illustrates a case with implant defects. In this case, a defect 806 exists because the area is implanted when it is not suppose to be. To detect this defect 806, the chip is scanned with an electron beam after the implant is performed and the mask resist is removed. The SEM tool shows voltage contrasts between the implanted areas 802.1–802.3 and the non-implanted areas 804.1–804.2. The defect 806 would have the same contrast as the implanted areas 802.1–802-3. In this manner, defects in structures with no topography can be detected.

Figure 8A:
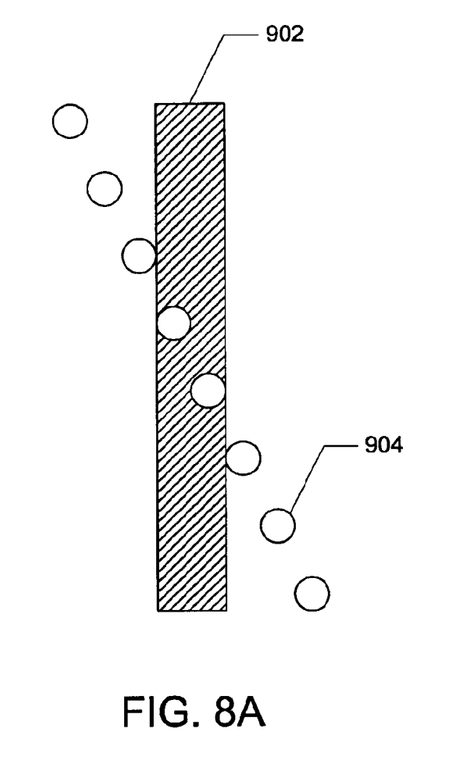
FIGS. 8A and 8B illustrate two methods for testing implants diffusion using the SEM tool.
Figure 8B:
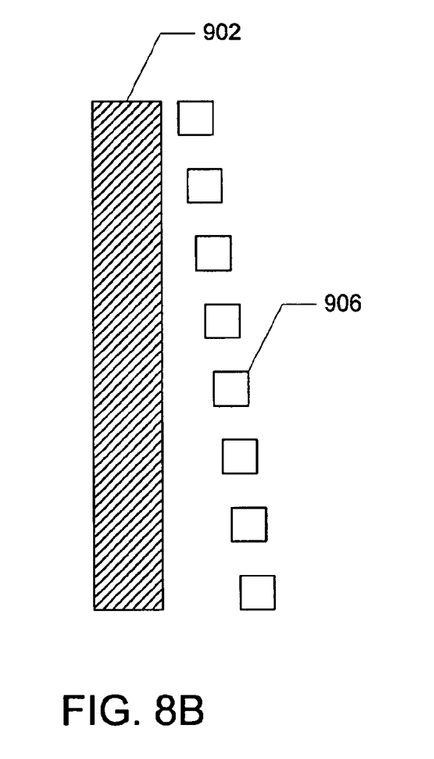

The SEM tool can also be used to better understand the diffusion of implants after they are subjected to thermal processes in subsequent steps. FIGS. 8A and 8B illustrate two methods for testing implants diffusion using the SEM tool. In FIG. 8A, contacts 904 are created along various parts of the length of the implant 902. These contacts 904 are then scanned with an electron beam by the SEM tool, showing the voltage contrasts on the contacts 904. The voltage contrasts indicate the width of diffusion of the implant 902. In FIG. 8B, individual areas of implants 906 along one side of the length of the implant 902 area are used instead of contacts. The chip is then scanned with an electron beam, and the voltage contrasts on the implants 906 shown by the SEM tool indicate the width of the diffusion of the implant 902. In this manner, the diffusion of implants can be better understood.

Figure 9A:
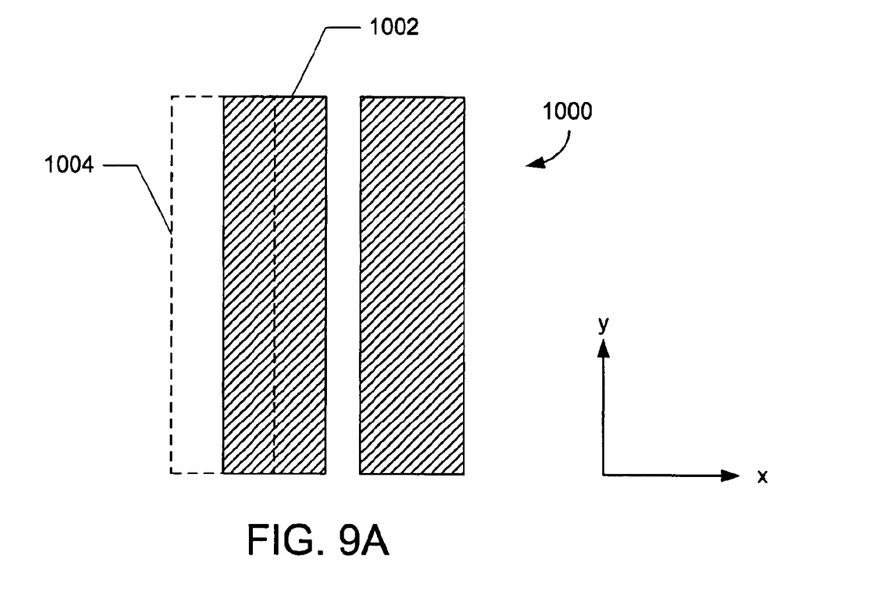
FIGS. 9A and 9B illustrate two test structures for defining the cause of implant failure in multiple independent bit Flash memory devices.
Figure 9B:
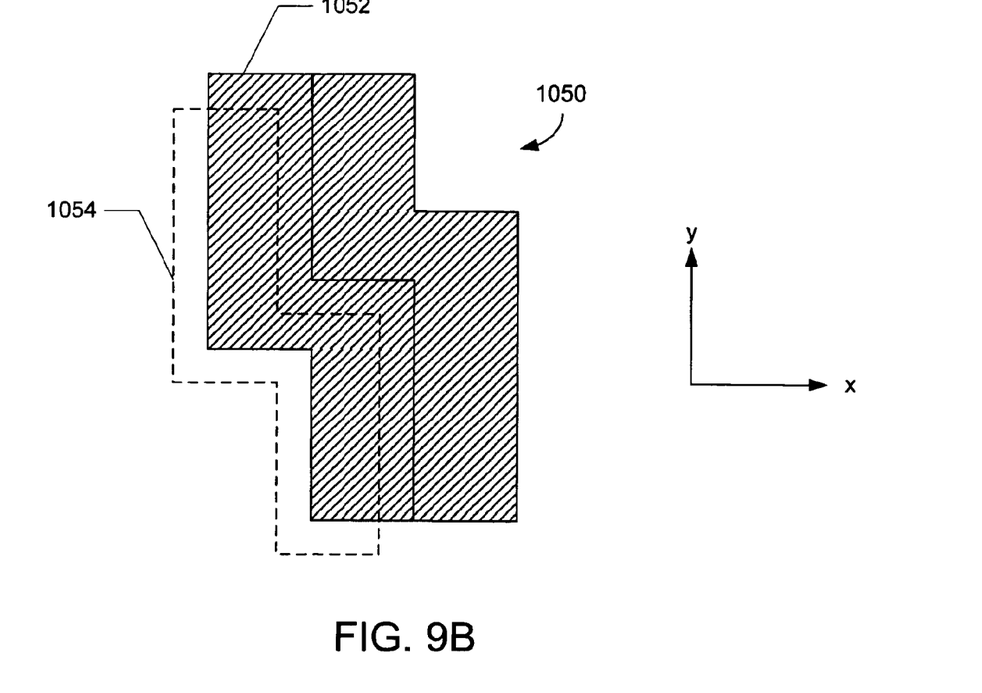

In the situation of implant failure for multiple independent bit Flash memory devices, there are two possible causes: implant mask misalignment or lateral diffusion due to thermal annealing. However, the implant failure itself does not indicate which cause resulted in the failure. FIGS. 9A and 9B illustrate two test structures for defining the cause of implant failure in multiple independent bit Flash memory devices. The test structures 1000 and 1050 are both created on a chip. The first test structure 1000 is implanted along one direction. The second test structure 1050 is implanted along two directions. If the actual implant 1002 of the first test structure 1000 is shifted along the x-axis from the ideal implant 1004, then the implant failure is due to an implant mask misalignment. If the actual implant 1052 of the second test structure 1050 is shifted along the x- and y-axes from the ideal implant 1054, then the implant failure is due to lateral diffusion due to thermal annealing. In this manner, the cause of implant failure in multiple independent bit flash memory devices can be defined.

An improved method for detecting bridge defects in multiple independent bit Flash memory devices has been disclosed. The method grounds every other polysilicon line, and then uses an electron beam scan tool to view voltage contrasts between the polysilicon lines. If consecutive polysilicon lines appear to be grounded, then this indicates that a bridge defect exists between two of the consecutively grounded polysilicon lines. With this method, bridge defects in multiple independent bit Flash memory devices are better detected, leading to improved yield and reliability of the devices.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for in-line testing of a chip to comprise multiple independent bit Flash memory devices, comprising the steps of:
   (a) grounding every other polysilicon line on the chip to emulate the multiple independent bit Flash memory devices, wherein an oxide line resides between every two polysilicon lines;
   (b) scanning the polysilicon lines with an electron beam;
   (c) examining voltage contrasts between the polysilicon lines; and
   (d) determining if there are consecutively grounded polysilicon lines based on the voltage contrasts.

2. The method of claim 1, further comprising:
   (e) determining that a bridge defect exists between two of the consecutively grounded polysilicon lines, if there are consecutively grounded polysilicon lines.

3. The method of claim 2, further comprising:
   (f) performing further tests to determine between which two of the consecutively grounded polysilicon lines the bridge defect exists.

4. The method of claim 1, further comprising:
   (e) determining that no bridge defect exists, if there are no consecutively grounded polysilicon lines.

5. The method of claim 1, wherein the examining step (c) is performed using a scanning electron microscope tool.

6. A method for in-line testing of a chip to comprise multiple independent bit Flash memory devices, comprising the steps of:
   (a) grounding every other polysilicon line on the chip to emulate the multiple independent bit Flash memory devices, wherein oxide lines reside between each polysilicon line;
   (b) scanning the polysilicon lines with an electron beam;
   (c) examining voltage contrasts between the polysilicon lines;
   (d) determining if there are consecutively grounded polysilicon lines based on the voltage contrasts; and
   (e) determining that a bridge defect exists between two of the consecutively grounded polysilicon lines, if there are consecutively grounded polysilicon lines.

7. The method of claim 1, further comprising:
   (f) determining that no bridge defect exists, if there are no consecutively grounded polysilicon lines.

8. The method of claim 1, wherein the examining step (c) is performed using a scanning electron microscope tool.

9. A method for detecting implant defects in a semiconductor device, comprising the steps of:
   (a) providing a plurality of implant lines in a substrate;
   (b) scanning the substrate with an electron beam;
   (c) examining voltage contrasts in the substrate; and
   (d) identifying implant defects from the voltage contrasts.

* * * * *